US009040964B2

United States Patent
Byun

(10) Patent No.: US 9,040,964 B2
(45) Date of Patent: May 26, 2015

(54) THIN FILM SEMICONDUCTOR DEVICE AND ORGANIC LIGHT-EMITTING DISPLAY APPARATUS

(71) Applicant: SAMSUNG DISPLAY CO., LTD., Yongin, Gyeonggi-Do (KR)

(72) Inventor: Ki-Yeol Byun, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/954,966

(22) Filed: Jul. 30, 2013

(65) Prior Publication Data

US 2014/0239267 A1   Aug. 28, 2014

(30) Foreign Application Priority Data

Feb. 28, 2013   (KR) .................. 10-2013-0022447

(51) Int. Cl.
*H01L 35/24* (2006.01)
*H01L 51/00* (2006.01)
*H01L 29/66* (2006.01)
*H01L 29/786* (2006.01)
*H01L 27/12* (2006.01)
*H01L 27/32* (2006.01)

(52) U.S. Cl.
CPC .... *H01L 29/66742* (2013.01); *H01L 29/78696* (2013.01); *H01L 27/1222* (2013.01); *H01L 27/3262* (2013.01)

(58) Field of Classification Search
USPC .................. 257/40, 66, 72, E29.273; 445/24
See application file for complete search history.

(56) References Cited

U.S. PATENT DOCUMENTS

| 7,423,293 | B2 * | 9/2008 | Yamagata et al. ............... 257/72 |
| 2008/0135849 | A1 | 6/2008 | Yamayoshi |
| 2011/0204427 | A1 * | 8/2011 | Choi et al. .................... 257/296 |
| 2011/0244751 | A1 * | 10/2011 | Choi et al. ........................ 445/24 |
| 2012/0120119 | A1 * | 5/2012 | Park et al. ....................... 345/690 |
| 2013/0005211 | A1 * | 1/2013 | Shin et al. ........................ 445/24 |
| 2013/0313530 | A1 * | 11/2013 | Seo et al. ......................... 257/40 |

FOREIGN PATENT DOCUMENTS

| KR | 10-2004-0070496 A | 8/2004 |
| KR | 10-2006-0101947 A | 9/2006 |
| KR | 10-2008-0054349 A | 6/2008 |
| KR | 10-2009-0128997 A | 12/2009 |

* cited by examiner

*Primary Examiner* — Phuc Dang
(74) *Attorney, Agent, or Firm* — Christie, Parker & Hale, LLP

(57) ABSTRACT

An apparatus and a method of manufacturing a thin film semiconductor device having a thin film transistor with improved electrical properties in organic light-emitting display apparatus are described.

11 Claims, 5 Drawing Sheets

THIN FILM SEMICONDUCTOR DEVICE AND ORGANIC LIGHT-EMITTING DISPLAY APPARATUS

CROSS-REFERENCE TO RELATED APPLICATION

This application claims priority to and the benefit of Korean Patent Application No. 10-2013-0022447, filed on Feb. 28, 2013, in the Korean Intellectual Property Office, the disclosure of which is incorporated herein in its entirety by reference.

BACKGROUND

1. Field

The embodiments of the present disclosure relate to a thin film semiconductor device including a thin film transistor having improved electrical properties, an organic light-emitting display apparatus including the thin film transistor, and a method of manufacturing the thin film semiconductor device.

2. Description of the Related Art

Manufacturing costs can be reduced by manufacturing semiconductor devices using a semiconductor glass substrate, as compared to manufacturing semiconductor devices using semiconductor substrates. Accordingly, thin film semiconductor devices, such as flat panel display apparatuses, are being used in various fields.

An organic light-emitting display apparatus has high luminance, low operating voltages, and high contrast ratio because it is self-light-emitting. The organic light-emitting display apparatus may be implemented in ultrathin displays, and has a response time of about several microseconds (μs), such that moving pictures are stably reproduced. Also, the organic light-emitting display apparatus has a very wide viewing angle, is stable at low temperatures, and is driven at low DC voltages.

The organic light-emitting display apparatus includes thin film transistors to control light emission of pixels. A thin film transistor includes an active pattern formed by patterning a semiconductor material layer. The active pattern formed according to a patterning process known in the art has an angled edge portion. As a result, the electric field is concentrated at the angled edge portion, rather than at a center portion of the active pattern. Thus, a weak inversion occurs in the angled edge portion of the active pattern at a low voltage, and a parasitic transistor is formed. Accordingly, an unwanted hump phenomenon may occur in response to a drain current Id for a gate voltage Vg. The hump phenomenon occurring at the angled edge portion of the active pattern increases leakage current, and thus cut-off properties of a transistor may be degraded. Also, these issues may function as parametric deviation factors of a thin film transistor, thereby causing random smudges on a panel.

SUMMARY

One or more embodiments of the present invention include a thin film semiconductor device having improved electrical properties (such as cut-off properties) of a thin film transistor, an organic light-emitting display apparatus, and a method of manufacturing the thin film semiconductor device.

Additional aspects will be set forth in part in the description which follows and, in part, will be apparent from the description, or may be learned by practice of the presented embodiments.

According to one or more embodiments of the present invention, a thin film semiconductor device may include a substrate and an active pattern on the substrate, and may include a rounded upper edge portion.

The thin film semiconductor device may further include a first gate insulation film that may expose the rounded upper edge portion of the active pattern and may cover a flat upper surface of the active pattern.

The thin film semiconductor device may further include a second gate insulation film that may cover the rounded upper edge portion of the active pattern and may cover the first gate insulation film, and a gate electrode that may overlap part of the active pattern, and the first gate insulation film and the second gate insulation film may be interposed between the active pattern and the gate electrode.

The active pattern may further include a rounded lower edge portion.

The thin film semiconductor may include a first buffer film on the substrate, and a second buffer film on the first buffer film, and may contact a flat lower surface of the active pattern without contacting the rounded lower edge portion of the active pattern.

The thin film semiconductor device may further include a thermal oxide film that may surround the rounded upper edge portion, the rounded lower edge portion, and a lateral surface of the active pattern, and a portion of the thermal oxide film on the rounded upper edge portion or on the rounded lower edge portion may be thicker than a portion of the thermal oxide film on the lateral surface.

The active pattern may further include a source region, a drain region, and a channel region between the source region and the drain region, and may include the rounded upper edge portion and a rounded lower edge portion.

The thin film semiconductor device may further include a gate electrode extending across the active pattern in the channel region of the active pattern.

The thin film semiconductor device may further include a buffer film interposed between the substrate and the active pattern, and the active pattern may further include an angled lower edge portion.

The active pattern may include a silicon material.

According to one or more embodiments of the present invention, an organic light-emitting display apparatus that may include a substrate, a plurality of thin film transistors on the substrate, a pixel electrode electrically connected to one of the plurality of thin film transistors, an opposed electrode on the pixel electrode, and an interlayer between the pixel electrode and the opposed electrode, and may include an organic light-emitting layer, and at least one of the plurality of thin film transistors may include an active pattern on the substrate and including a rounded upper edge portion.

The organic light-emitting display apparatus may include a first gate insulation film that may expose the rounded upper edge portion and may cover a flat portion of an upper surface of the active pattern, a second gate insulation film that may cover the rounded upper edge portion and the first gate insulation film, and a gate electrode on the first gate insulation film and the second gate insulation film, and overlapping part of the active pattern.

The active pattern may include a rounded lower edge portion.

The organic light-emitting display apparatus may further include a first buffer film on the substrate, and a second buffer film on the first buffer film, and may contact a flat lower surface of the active pattern without contacting the rounded lower edge portion of the active pattern.

The active pattern may include a source region, a drain region, and a channel region between the source region and the drain region and may include the rounded upper edge portion and a rounded lower edge portion.

According to one or more embodiments of the present invention, a method of manufacturing a thin film semiconductor device may include forming a first material pattern, an active material pattern, and a second material pattern, that are sequentially stacked on a substrate, removing a lateral portion of the first material pattern and a lateral portion of the second material pattern to expose an upper edge portion and a lower edge portion of the active material pattern, rounding the exposed upper edge portion and the exposed lower edge portion of the active material pattern, forming a gate insulation film on the substrate, and forming a conductive pattern on the gate insulation film extending across a part of the active material pattern.

The forming of the first material pattern, the active material pattern, and the second material pattern may include, forming a buffer film on the substrate, may sequentially form a first material film, an active material film, a second material film, and a hard mask pattern on the buffer film, and may pattern the first material film, the active material film, and the second material film using the hard mask pattern as an etch mask.

The removing the lateral portion of the first material pattern and the lateral portion of the second material pattern may include wet etching the first material pattern and the second material pattern, and may use the buffer film, the active material pattern, and the hard mask pattern as an etch mask.

The rounding the exposed upper edge portion and the exposed lower edge portion of the active material pattern may include thermally oxidizing the exposed upper edge portion and the exposed lower edge portion of the active material pattern.

The rounding the exposed upper edge portion and the exposed lower edge portion of the active material pattern may include wet etching the exposed upper edge portion and the exposed lower edge portion of the active material pattern.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
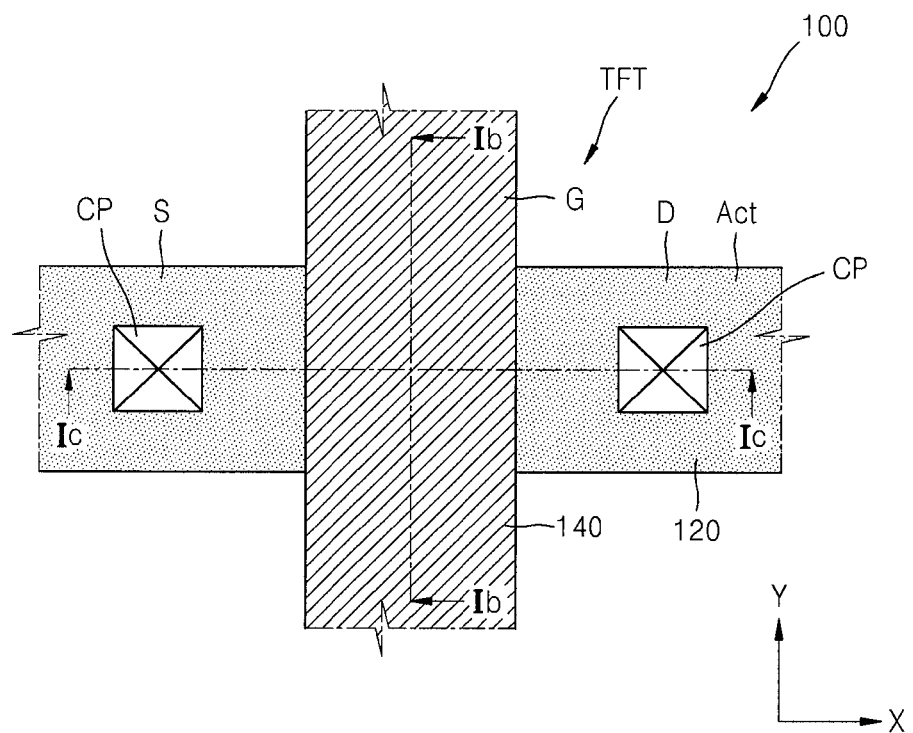
FIG. 1A is a plan view illustrating a thin film semiconductor device according to various embodiments of the present invention.

Hereinafter, example embodiments of the present invention are described in detail with reference to the accompanying drawings. In the drawings, the illustrated shapes may be modified according to, for example, manufacturing technology and/or tolerance. Thus, the example embodiments of the present invention may not be limited to particular shapes described in the present disclosure, and may include other shapes that may be generated during, for example, manufacturing.

In the present disclosure, when a layer is described as existing on another layer, the layer may exist directly on the other layer, or a third layer may be interposed therebetween. Also, the thickness or size of each layer illustrated in the drawings may be exaggerated for convenience of explanation and clarity. Like references indicate like constituent elements in the drawings. Herein the present disclosure, the term "and/or" is intended to include any single one of the listed items to which the term corresponds, as well as any combination of the listed items.

The terms mentioned in the present disclosure are for the purpose of explaining specific example embodiments, and not intended to limit the embodiments of the present invention. Thus, the expression of singularity in the present specification includes the expression of plurality unless clearly specified otherwise in context. Also, the terms such as "comprise" and/or "comprising" may be construed to denote a certain characteristic, number, step, operation, constituent element, or a combination thereof, and does not exclude the existence of, or a possibility of additional one or more other characteristics, numbers, steps, operations, constituent elements, or combinations thereof.

The terms such as "first" and "second" are used herein, merely to describe a variety of members, parts, areas, layers, and/or portions, but the constituent elements are not limited by the terms. The members, parts, areas, layers, and/or portions are not limited by the terms. The terms are used for the purpose of distinguishing one constituent element from another constituent element. Thus, without departing from the intended scope of the embodiments of the present disclosure, a first member, part, area, layer, or portion may refer to, for example, a second member, part, area, layer, or portion.

Unless defined otherwise, the terms used herein, including technical or scientific terms, have similar meanings as those generally understood by those having ordinary skill in the art to which the embodiments of the present invention may pertain. The terms as those defined in generally used dictionaries are construed to have meanings matching those in the context of related technology and, unless clearly defined otherwise, are not construed to be ideally or excessively formal.

Expressions such as "at least one of," when preceding a list of elements, modify the entire list of elements, and do not modify the individual elements of the list.

FIG. 1A is a plan view illustrating a thin film semiconductor device 100 according to various embodiments of the present invention. Referring to FIG. 1A, the thin film semiconductor device 100 includes a thin film transistor (TFT) that includes an active pattern (Act) extending in a first direction X, and a gate pattern G extending in a second direction Y. A source region S and a drain region D are defined in the active pattern Act. Contact plugs CP connected to the source region S and the drain region D are also provided.

The thin film semiconductor device 100 may include all devices that include a TFT. For example, the thin film semiconductor device 100 may be an organic light-emitting display apparatus including a backplane where an array of TFTs is formed, a liquid crystal display apparatus, etc.

The gate pattern G and the active pattern Act may be spaced/separated from each other. In some embodiments of the present invention, the gate pattern G and the active pattern Act may be insulated from each other by a gate insulation film interposed therebetween.

A portion of the active pattern Act may overlap with the gate pattern G. The overlapping portion of the active pattern Act may be referred to as a channel region where an inversion layer is formed when a voltage is applied to the gate pattern G. The channel region may be located between the source region S and the drain region D. A measurement in the first direction X defines a channel length, and a measurement in the second direction Y defines a channel width. Thus, the first direction X may be referred to as a channel length direction, and the second direction Y may be referred to as a channel width direction.

Although FIG. 1A illustrates that the first direction X (in which the active pattern Act extends) and the second direction Y (in which the gate pattern G extends) are perpendicular to each other, the embodiments of the present invention are not necessarily limited by an angle made by the first direction X and the second direction Y. Although FIG. 1A illustrates a top-gate type TFT in which the gate pattern G is arranged above the active pattern Act, the embodiments of the present invention are not limited thereto. Some embodiments of the present invention may comprise a bottom-gate type TFT in which the gate pattern G is arranged under the active pattern Act. The embodiments in the following description will be described based on the top-gate type TFT.

Figure 1B:
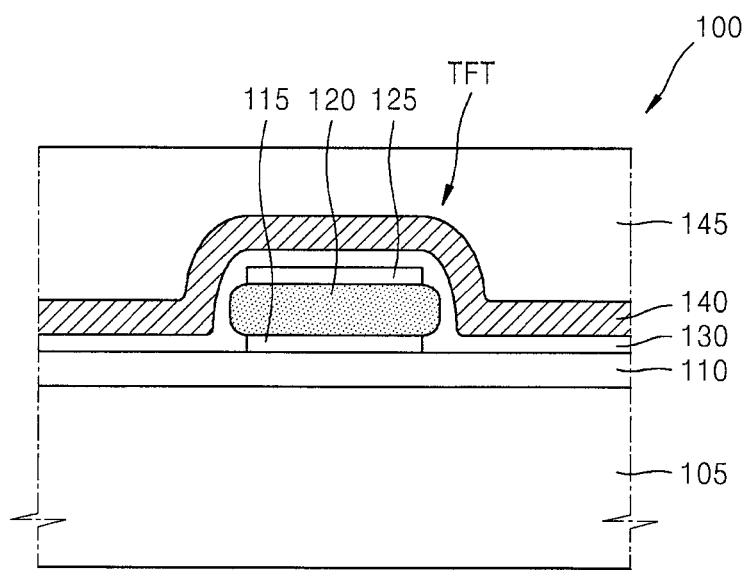
FIG. 1B is a cross-sectional view of the thin film semiconductor device of FIG. 1A taken along the line Ib-Ib extending in a second direction Y.

FIG. 1B is a cross-sectional view of the thin film semiconductor device 100 of FIG. 1A, taken along the line Ib-Ib and extending in the second direction Y. Referring to FIG. 1B, the thin film semiconductor device 100 includes a substrate 105 and an active pattern 120 on the substrate 105. The active pattern 120 has rounded upper and lower edge portions, as illustrated in FIG. 1B. The cross-section of the active pattern 120 illustrated in FIG. 1B is taken along the second direction Y, that is, the channel width direction.

In some embodiments of the present invention, the thin film semiconductor device 100 may further include a first buffer film 110 arranged on the substrate 105, and a second buffer film 115 arranged between the first buffer film 110 and the active pattern 120. The thin film semiconductor device 100 may further include a first gate insulation film 125 arranged on the active pattern 120, and a second gate insulation film 130 arranged on the active pattern 120 and on the first gate insulation film 125. The thin film semiconductor device 100 may further include a gate electrode 140 that extends along the second direction Y on the second gate insulation film 130.

In some embodiments of the present invention, the substrate 105 may be an insulation substrate formed of a transparent plastic material or a transparent glass material having $SiO_2$ as a main ingredient. In some embodiments of the present invention, the substrate 105 may be a conductive substrate formed of a thin film metal material. In some embodiments of the present invention, the substrate 105 may be a flexible substrate or a rigid substrate.

The first buffer film 110 may be arranged on the substrate 105 to reduce or prevent dispersion of impurity ions, to reduce or prevent intrusion of external moisture or air, and to provide a planarized surface. The first buffer film 110 may be formed on an entire surface of the substrate 105.

The active pattern 120 may be arranged on the first buffer film 110. As illustrated in FIG. 1B, the active pattern 120 may have a substantially rectangular cross-section with rounded edge/corner portions. According to the cross-section of the active pattern 120 of FIG. 1B, the active pattern 120 may have substantially flat upper, lower, and lateral surfaces, and may have four rounded edge portions.

The second buffer film 115 may be interposed between the first buffer film 110 and the active pattern 120. As illustrated in FIG. 1B, the second buffer film 115 may contact the flat lower surface of the active pattern 120 while not contacting the rounded lower edge portions of the active pattern 120. The second buffer film 115 may be arranged under a center portion of the flat lower surface of the active pattern 120, while not being under the rounded lower edge portions of the active pattern 120.

The first gate insulation film 125 may be arranged on the active pattern 120. The first gate insulation film 125 may contact the flat upper surface of the active pattern 120 while not contacting the rounded upper edge portions of the active pattern 120. That is, the first gate insulation film 125 may be arranged at a center portion of the flat upper surface of the active pattern 120 while not being above the rounded upper edge portions of the active pattern 120.

The second gate insulation film 130 may be arranged on/over substantially an entire surface of the substrate 105 to cover the active pattern 120 and the first gate insulation film 125. Although the second gate insulation film 130 is illustrated as a single layer, the second gate insulation film 130 may have a structure in which a plurality of film materials are stacked. Although FIG. 1B illustrates that the thickness of the first gate insulation film 125 and the thickness of the second gate insulation film 130 are similar to each other, the illustrations are intended to merely show example embodiments of the present invention, and the thicknesses of the first gate insulation film 125 and the second gate insulation film 130 may be different from each other. Although FIG. 1B illustrates that the thickness of the portion of the second gate insulation film 130 covering the first gate insulation film 125, and the thickness of the portion of the second gate insulation film 130 covering a lateral portion of the active pattern 120 are similar to each other, the thickness of the portion of the second gate insulation film 130 that covers the lateral portion of the active pattern 120 may be thicker than the thickness of the portion of the second gate insulation film 130 that covers the first gate insulation film 125 (for example, by changing process conditions).

The gate electrode 140 may be arranged on the second gate insulation film 130. The gate electrode 140 may correspond to the gate pattern G of FIG. 1A, and may extend along the second direction Y in the channel region of the active pattern 120. As illustrated in FIG. 1B, the gate electrode 140 may be arranged to cover the lateral surface of the channel region of the active pattern 120. As illustrated in FIG. 1B, because the gate electrode 140 may be arranged close to, not only the upper edge portions of the active pattern 120, but also to the lower edge portions of the active pattern 120, an electric field may be concentrated on the lower edge portions. Thus, the lower edge portions of the active pattern 120 may be rounded as well. As a result, a hump may be prevented from occurring through the lower edge portions of the active pattern 120. The gate electrode 140 and the second gate insulation film 130 may be covered by an interlayer insulation film 145.

Figure 1C:
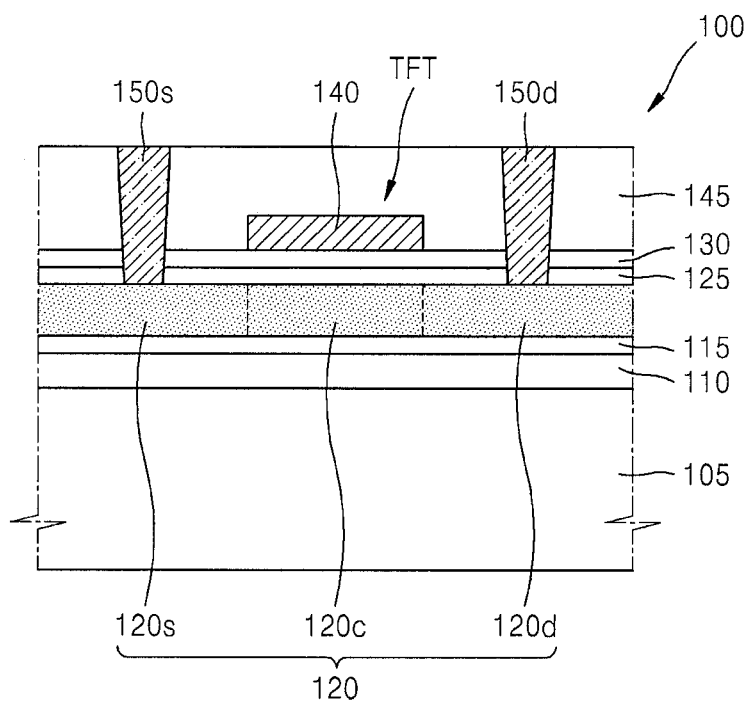
FIG. 1C is a cross-sectional view of the thin film semiconductor device of FIG. 1A taken along the line Ic-Ic extending in a first direction X.

FIG. 1C is a cross-sectional view of the thin film semiconductor device 100 of FIG. 1A, taken along the line Ic-Ic extending in a first direction X, that is, the channel length direction.

The first buffer film 110 and the second buffer film 115 may be arranged on the substrate 105. The active pattern 120 may be arranged on the second buffer film 115. The first gate insulation film 125 and the second gate insulation film 130 may be interposed between the active pattern 120 and the gate electrode 140.

The active pattern 120 may include a channel region 120c under the gate electrode 140, and a source region 120s and a drain region 120d arranged at the opposite sides of the active pattern 120/channel region 120c.

The interlayer insulation film 145 may be arranged on the second gate insulation film 130 and the gate electrode 140. In some embodiments of the present invention, a source contact plug 150s and a drain contact plug 150d may be respectively electrically connected to the source region 120s and the drain region 120d, and may be arranged such that the source contact plug 150s and the drain contact plug 150d penetrate the first gate insulation film 125, the second gate insulation film 130, and the interlayer insulation film 145.

Figure 2:
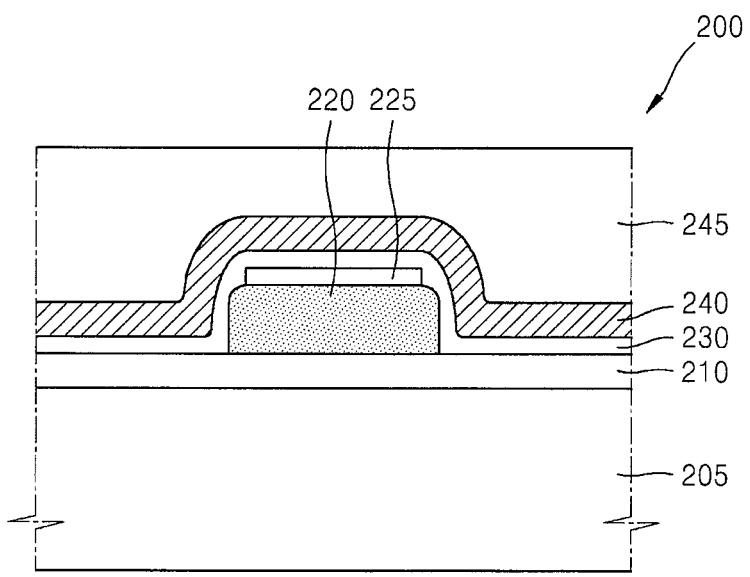
FIG. 2 is a cross-sectional view schematically illustrating a thin film semiconductor device according to various embodiments of the present invention.

FIG. 2 is a cross-sectional view illustrating a thin film semiconductor device 200 according to various embodiments of the present invention. Referring to FIG. 2, similar to the cross-section of the thin film semiconductor device 100 shown in FIG. 1B, a cross-section of the thin film semiconductor device 200 taken along a line extending in the second direction Y is illustrated.

The thin film semiconductor device 200 is similar to the thin film semiconductor device 100, except that the lower edge portions of an active pattern 220 are not rounded, and that the active pattern 220 is arranged directly on (e.g., directly contacts) the first buffer film 210. The thin film semiconductor device 200 includes a substrate 205, a first buffer film 210, a first gate insulation film 225, a second gate insulation film 230, a gate electrode 240, and an interlayer insulation film 245, which correspond respectively to the substrate 105, the first buffer film 110, the first gate insulation film 125, the second gate insulation film 130, the gate electrode 140, and the interlayer insulation film 145 of FIGS. 1A-1C. Thus, the other constituent elements except for the active pattern 220 are not described in the following description of the embodiment shown in FIG. 2.

As illustrated in FIG. 2, the active pattern 220 may have rounded upper edge portions and angled lower edge portions (e.g., squared lower edge portions). In some embodiments of the present invention, the active pattern 220 may be arranged directly on the first buffer film 210. In other words, the second buffer film 115 shown in FIG. 1B, and that is arranged between the active pattern 120 and the first buffer film 110, may be omitted in the present embodiment.

The gate electrode 240 may be arranged above the active pattern 220 corresponding to (e.g., between) the rounded upper edge portions of the active pattern 220. In some embodiments of the present invention, the thin film semiconductor device 200 can have a bottom gate structure in which a gate electrode may be arranged under an active pattern, the active pattern may have rounded lower edge portions and angled (e.g., squared) upper edge portions.

Figure 3:
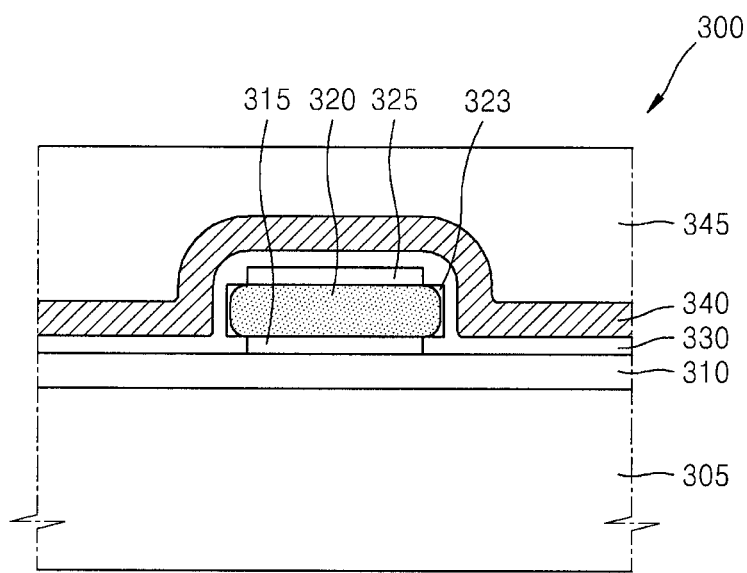
FIG. 3 is a cross-sectional view schematically illustrating a thin film semiconductor device according to various embodiments of the present invention.

FIG. 3 is a cross-sectional view illustrating a thin film semiconductor device 300 according to various embodiments of the present invention. Referring to FIG. 3, similar to the cross-section of the thin film semiconductor device 100 of FIG. 1B, a cross-section of the thin film semiconductor device 300 taken along a line extending in the second direction Y is illustrated in FIG. 3.

The thin film semiconductor device 300 is similar to the thin film semiconductor device 100, except that a thermal oxide film 323 surrounds, or corresponds to, a lateral portion of an active pattern 320. The thin film semiconductor device 300 includes a substrate 305, a first buffer film 310, a second buffer film 315, a first gate insulation film 325, a second gate insulation film 330, a gate electrode 340, and an interlayer insulation film 345, which correspond, respectively, to the substrate 105, the first buffer film 110, the second buffer film 115, the first gate insulation film 125, the second gate insulation film 130, the gate electrode 140, and the interlayer insulation film 145. Thus, the other constituent elements except for the active pattern 320 and except for the thermal oxide film 323 are not described in the following description of the embodiment shown in FIG. 3.

According to the cross-section of the active pattern 320 of FIG. 3, the lateral portion of the active pattern 320 may include rounded upper edge portions, flat lateral surfaces, and rounded lower edge portions (e.g., rounded upper and lower corners with straight lateral surfaces therebetween). The thermal oxide film 323 may be arranged on, or correspond to, lateral portions of the active pattern 320. In some embodiments, the thermal oxide film 323 may completely surround the lateral portions of the active pattern 320.

As it is further described below, the thermal oxide film 323 may be formed of silicon oxide that is obtained by exposing the active pattern 320 formed of a silicon material to an oxygen atmosphere at a high temperature. As illustrated in FIG. 3, a portion of the thermal oxide film 323 covering the rounded upper and lower edge portions of the active pattern 320 may be thicker than a portion of the thermal oxide film 323 covering the flat lateral surfaces of the active pattern 320. Although not illustrated in FIG. 2, in some embodiments of the present invention, the thin film semiconductor device 200 may also include a thermal oxide film that surrounds a lateral portion of the active pattern 220.

FIGS. 4A to 4E are cross-sectional views for explaining an example method of manufacturing a thin film semiconductor device according to various embodiments of the present invention. By way of example, and not by way of limitation, a method for manufacturing the thin film semiconductor device 100 of the embodiment shown in FIGS. 1A to 1C is described.

Figure 4A:
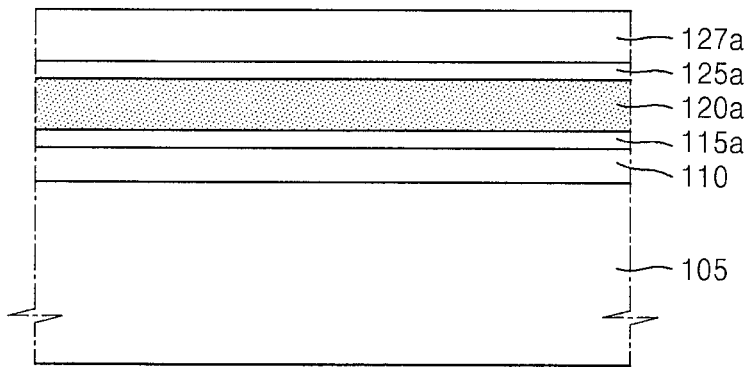
FIGS. 4A to 4E are cross-sectional views showing a method of manufacturing a thin film semiconductor device, such as, for example, the thin film semiconductor device of FIGS. 1A to 1C, according to various embodiments of the present invention.

Referring to FIG. 4A, the first buffer film 110, a second buffer material film 115a, an active material film 120a, a first gate insulation material film 125a, and an etch mask material film 127a are sequentially formed on the substrate 105. The substrate 105 may be formed of a transparent glass material having $SiO_2$ as a main ingredient. The embodiments of the present invention are not limited thereto, and the substrate 105 may be formed of a transparent plastic material.

The first buffer film 110, such as a barrier film and/or a blocking film, may be arranged on the substrate 105 to reduce or prevent dispersion of impurity ions and intrusion of external moisture or air, and to provide a planarized surface. The first buffer film 110 may be formed of an inorganic insulation material such as, but not limited to, silicon oxide, silicon nitride, silicon oxynitride, aluminum oxide, aluminum nitride, titanium oxide, or titanium nitride, and may be formed by a variety of deposition methods such as a plasma enhanced chemical vapor deposition (PECVD) method, an atmospheric pressure CVD (APCVD) method, and a low pressure CVD (LPCVD) method.

The second buffer material film 115a may be arranged on the first buffer film 110. The second buffer material film 115a may be formed of an inorganic insulation material such as silicon oxide, silicon nitride, silicon oxynitride, aluminum oxide, aluminum nitride, titanium oxide, or titanium nitride, and may be formed by a variety of deposition methods such as a PECVD method, an APCVD method, and a LPCVD method. The second buffer material film 115a may be formed of a material having high etch selectivity with respect to the first buffer film 110.

In some embodiments of the present invention, when the second buffer material film 115a is formed of a material having high etch selectivity with respect to the substrate 105, the first buffer film 110 may be omitted. In the following description, by way of example, it is assumed that the first buffer film 110 is formed of silicon nitride, and that the second buffer material film 115a is formed of silicon oxynitride, although other materials may be used.

The active material film 120a, which will become/function as the active pattern 120 of the TFT, may be arranged on the second buffer material film 115a. The active material film 120a may be a semiconductor material film. For example, the active material film 120a may be a silicon material film such as a polysilicon material film. The active material film 120a may be formed of a material having high etch selectivity with respect to the second buffer material film 115a.

In some embodiments, the active material film 120a that is formed of polysilicon may be formed by depositing a semiconductor material film such as, for example, an amorphous silicon layer on the second buffer material film 115a, and by then crystallizing the amorphous silicon layer. The amorphous silicon may be crystallized by a variety of methods, such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method.

The first gate insulation material film 125a may be arranged on the active material film 120a. The first gate insulation material film 125a may be formed of an inorganic insulation material such as silicon oxide, silicon nitride, silicon oxynitride, aluminum oxide, aluminum nitride, titanium oxide, or titanium nitride, and may be formed by a variety of deposition methods such as a PECVD method, an APCVD method, and a LPCVD method. The first gate insulation material film 125a may be formed of a material having higher etch selectivity with respect to the active material film 120a. In some embodiments, the first gate insulation material film 125a may be formed of the same material as the second buffer material film 115a. For example, the first gate insulation material film 125a and the second buffer material film 115a may be formed of silicon oxide.

The etch mask material film 127a may be arranged on the first gate insulation material film 125a. The etch mask material film 127a may be formed of an inorganic insulation material such as, for example, silicon oxide, silicon nitride, silicon oxynitride, aluminum oxide, aluminum nitride, titanium oxide, or titanium nitride, and may be formed of a variety of deposition methods such as a PECVD method, an APCVD method, or a LPCVD method. The etch mask material film 127a may be formed of a material that may be used as an etch mask during patterning of the second buffer material film 115a, the active material film 120a, and the first gate insulation material film 125a, which are arranged under the etch mask material film 127a. For example, the etch mask material film 127a may be formed of the same material as the first buffer film 110, such as, for example, silicon nitride.

Although the first buffer film 110, the second buffer material film 115a, the active material film 120a, the first gate insulation material film 125a, and the etch mask material film 127a each are illustrated as an individual, single material film, this is a mere example and any one of them may have a structure comprising a plurality of material films.

Figure 4B:
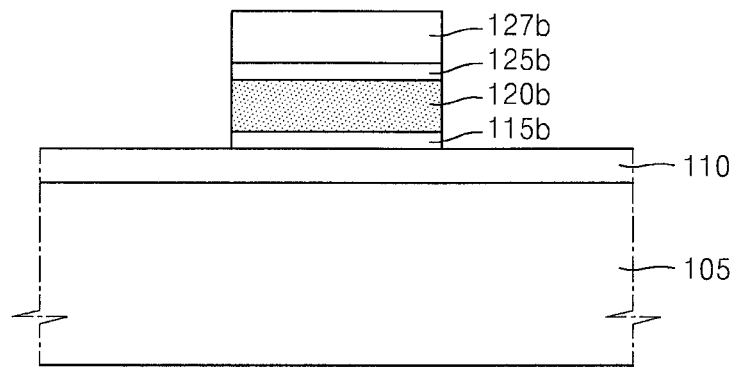

Referring to FIG. 4B, the second buffer material film 115a, the active material film 120a, the first gate insulation material film 125a, and the etch mask material film 127a of FIG. 4A are patterned, and thus the second buffer material pattern 115b, the active material pattern 120b, the first gate insulation material pattern 125b, and the etch mask pattern 127b are formed on the first buffer film 110.

In detail, a first mask corresponding to the etch mask pattern 127b may be formed on the etch mask material film 127a. Then, the etch mask material film 127a may be patterned into the etch mask pattern 127b by an etching process using the first mask as an etch mask. The first mask may then be removed.

Next, the first gate insulation film 125a, the active material film 120a, and the second buffer material film 115a are sequentially etched by using the etch mask pattern 127b as an etch mask, and thus the second buffer material pattern 115b, the active material pattern 120b, and the first gate insulation material pattern 125b may be formed on the first buffer film 110. As described above, the etch mask pattern 127b and the first buffer film 110 may be formed of silicon nitride, the second buffer material pattern 115b and the first gate insulation material pattern 125b may be formed of silicon oxide, and the active material pattern 120b may be formed of a silicon material.

According to another embodiment, the second buffer material pattern 115b and the first gate insulation material pattern 125b may be formed of silicon nitride, the active material pattern 120b may be formed of a silicon material, the first buffer film 110 may be omitted, and the etch mask pattern 127b may be formed of a material having etch selectivity with respect to silicon, silicon nitride, and silicon oxide.

Figure 4C:
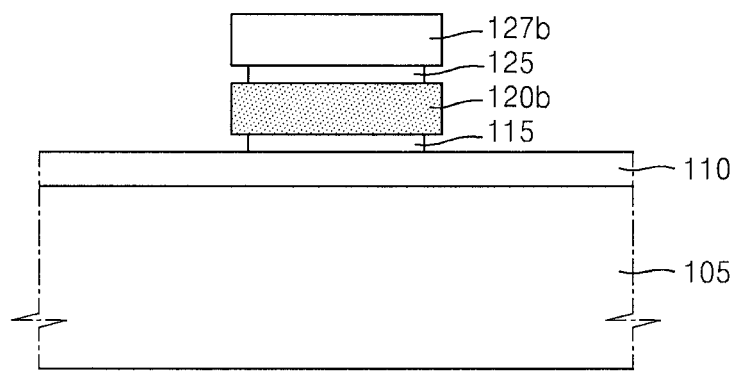

Referring to FIG. 4C, lateral portions of the second buffer film pattern 115b and the first gate insulation film pattern 125b of FIG. 4B are removed to expose upper and lower edge portions of the active material pattern 120b and to form the second buffer film 115 and the first gate insulation film 125 as illustrated in FIG. 4C. The lateral portions of the second buffer film pattern 115b and the first gate insulation film pattern 125b include exposed lateral surfaces of the second buffer film pattern 115b and the first gate insulation film pattern 125b in FIG. 4B. As a result, the second buffer film 115 and the first gate insulation film 125 are formed such that lateral surfaces of the second buffer film 115 and the first gate insulation film 125 are located at positions that are further inward than lateral surfaces of the etch mask pattern 127b and the active pattern 120b.

In some embodiments of the present invention, the exposed lateral portions of the second buffer film pattern 115b and the first gate insulation film pattern 125b may collapse inwardly (may be etched in an inward direction) by wet etching. The first buffer film 110, the active material pattern 120b, and the etch mask pattern 127b may be used as etch masks.

In some embodiments, not only the lateral portions of the second buffer film pattern 115b and the first gate insulation film pattern 125b illustrated in FIG. 4B are removed, but other lateral portions of the second buffer film 115 and the first gate insulation film 125 may also be removed.

As described above, to remove the lateral portions of the second buffer film pattern 115b and the first gate insulation film pattern 125b at the same time by using the same wet etchant, the second buffer film 115 and the first gate insulation film 125 may be formed of the same material. When the second buffer film 115 and the first gate insulation film 125 are formed of different materials, the wet etching process may be performed twice.

In some embodiments, the second buffer film 115 and the first gate insulation film 125 may be formed by different materials having different etch selectivity so that either the upper edge portion or the lower edge portion of the active material pattern 120b is exposed.

Figure 4D:
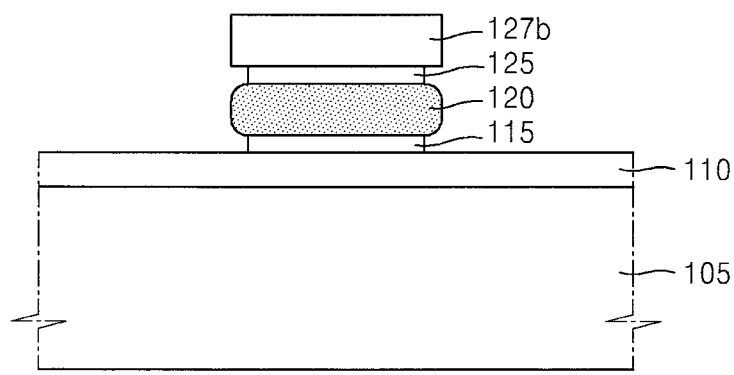

Referring to FIG. 4D, the active material pattern 120b of FIG. 4C may be rounded to form the active pattern 120 having rounded edge portions. In some embodiments, the exposed edge portions and the lateral surfaces of the active material pattern 120b may be etched isotropically. Because etch speed (e.g., a rate of etching) at the edge portion is faster than the etch speed at the flat portion, the active material pattern 120b may be rounded, as illustrated in FIG. 4D, when isotropic etching is performed. According to another embodiment of the present invention, the exposed edge portions and the lateral surfaces of the active material pattern 120b may be wet etched.

According to another embodiment of the present invention, the edge portions and the lateral surfaces of the active material pattern 120b may be exposed to a high temperature in an atmosphere comprising oxygen. As a result, an oxide film, such as the thermal oxide film 323 of FIG. 3, may be formed at the edge portions and the lateral portions of the active pattern 120, as illustrated in the active pattern 320 illustrated in FIG. 3. The oxide film is formed of an insulation material. The active material pattern 120b of FIG. 4C is modified/deformed to the active pattern 120 having rounded edge portions as illustrated in FIG. 4D.

Because a polysilicon material oxidizes at a lower temperature than a crystalline silicon material, the active pattern 120 may be formed of a polysilicon material. In some embodiments, not only edge portions in one direction, but the edge portions in the other direction may also be rounded. In other words, the edge portions located at end portions of the active pattern Act in the first direction X in FIG. 1A may be rounded as well.

Figure 4E:
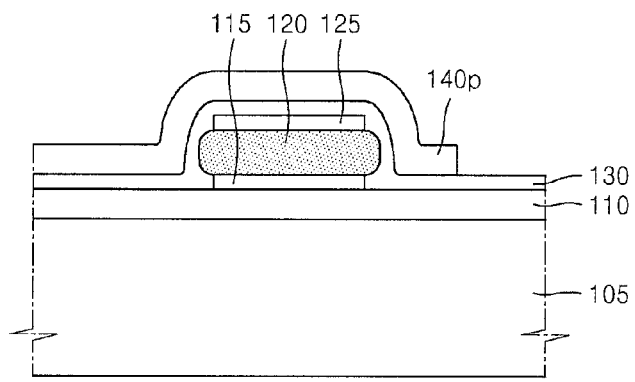

Referring to FIG. 4E, the etch mask pattern 127b is removed, and the second gate insulation film 130 covering the active pattern 120 and the first gate insulation film 125 is formed. Then, a conductive pattern 140p is formed on the second gate insulation film 130. In detail, after the active pattern 120 having rounded edge portions is formed, the etch mask pattern 127b may be removed by using, for example, wet etching.

To cover the exposed portion of the active pattern 120, the second gate insulation film 130 covering the active pattern 120 and the first gate insulation film 125 may be formed. Next, a conductive material layer is stacked on the second gate insulation film 130 and the conductive material layer may be patterned to the conductive pattern 140p by using, for example, a photolithography process and an etching process using a second mask. As described above, the conductive pattern 140p may correspond to the gate electrode 140 of FIG. 1B. Thereafter, the interlayer insulation film 145 of FIG. 1B may be formed to cover the conductive pattern 140p.

Figure 5:
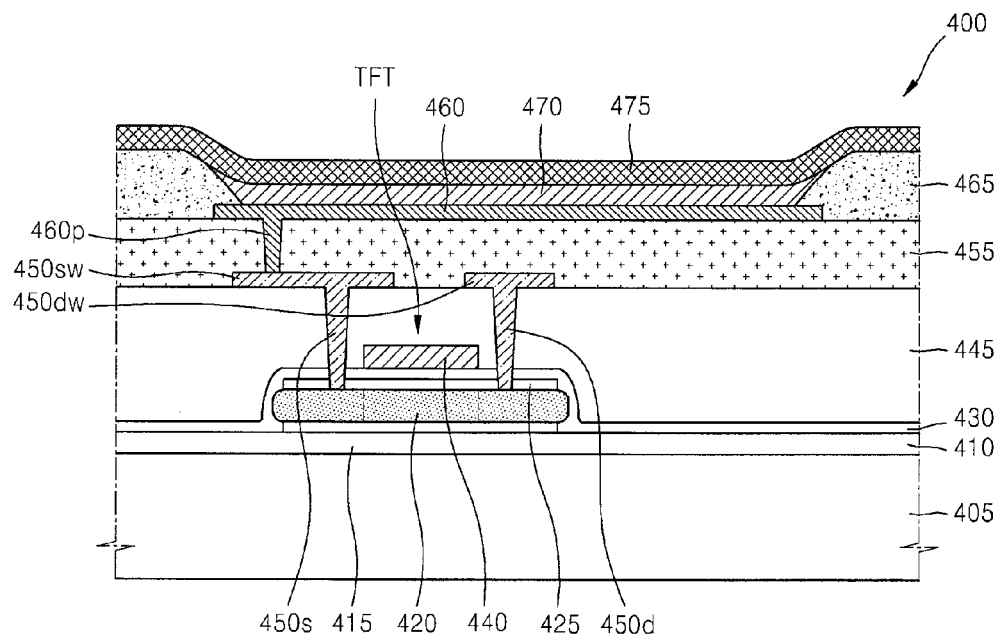
FIG. 5 is a cross-sectional view illustrating an organic light-emitting display apparatus according to various embodiments of the present invention.

FIG. 5 is a cross-sectional view illustrating an organic light-emitting display apparatus 400 according to various embodiments of the present invention. Referring to FIG. 5, the organic light-emitting display apparatus 400 includes a substrate 405, a thin film transistor (TFT) on the substrate 405, a pixel electrode 460 electrically connected to the TFT, an opposed electrode 475 on the pixel electrode 460, and an interlayer 470 arranged between the pixel electrode 460 and the opposed electrode 475 and having an organic light-emitting layer. The TFT includes an active pattern 420 that may be arranged on the substrate 405 and has rounded upper and lower edge portions.

The TFT of FIG. 5 may correspond to the TFT of FIG. 1C, and the active pattern 120 of FIG. 1C may correspond to a part of the active pattern 420 of FIG. 5. As described above, the edge portions of the active pattern 120 may be rounded. In other words, in addition to the edge portions located in the channel region of the active pattern Act being rounded, as illustrated in FIG. 1B, the edge portions located in a source region and a drain region of the active pattern 420 may also be rounded, as illustrated in FIG. 5.

The substrate 405, a first buffer film 410, a second buffer film 415, the active pattern 420, a first gate insulation film 425, a second gate insulation film 430, a gate electrode 440, an interlayer insulation film 445, a source contact plug 450s, and a drain contact plug 450d of FIG. 5 correspond respectively to the substrate 105, the first buffer film 110, the second buffer film 115, the active pattern 120, the first gate insulation film 125, the second gate insulation film 130, the gate electrode 140, the interlayer insulation film 145, the source contact plug 150s, and the drain contact plug 150d of the organic light-emitting display apparatus 100 that are illustrated in FIGS. 1B and 1C. The descriptions of the substrate 405, the first buffer film 410, the second buffer film 415, the active pattern 420, the first gate insulation film 425, the second gate insulation film 430, the gate electrode 440, the interlayer insulation film 445, the source contact plug 450s, and the drain contact plug 450d are omitted herein because the corresponding elements are described above with reference to FIGS. 1A to 1C.

A source wiring 450sw electrically connected to the source contact plug 450s and a drain wiring 450dw electrically connected to the drain contact plug 450d may be arranged on the interlayer insulation film 445. A planarization film 455 covering the source wiring 450sw and the drain wiring 450dw may be arranged on the interlayer insulation film 445. The planarization film 455 may be formed of an inorganic insulation material including, but not limited to, oxide, nitride, and/or oxynitride, or formed of an organic insulation material.

The pixel electrode 460 may be arranged on the planarization film 455, and may be electrically connected to, for example, the source wiring 450sw, via the contact plug 460p that penetrates the planarization film 455.

The pixel electrode 460 may be a transparent electrode or a reflection type electrode. When the pixel electrode 460 is used as a transparent electrode, the pixel electrode 460 may include, but is not be limited to, ITO, IZO, ZnO, or $In_2O_3$. Also, when the pixel electrode 460 is used as a reflection type electrode, the pixel electrode 460 may have a multilayer structure including a first layer, which may be formed of Ag, Mg, Al, Pt, Pd, Au, Ni, Nd, Ir, Cr, or a compound thereof, and a second layer stacked on the first layer and including, for example, ITO, IZO, ZnO, or $In_2O_3$.

A pixel defining layer 465, which defines a pixel by exposing a part of the pixel electrode 460, may be arranged on the planarization film 455. The interlayer 470 including an organic light-emitting layer may be arranged on the pixel electrode 460 that is exposed by the pixel defining layer 465.

The opposed electrode (e.g., a counter electrode) 475 may be arranged across the entire surface of the substrate 405. The opposed electrode 475 may be formed as a transparent electrode or as a reflection type electrode. When the opposed electrode 475 is a transparent electrode, the opposed electrode 475 may include a first layer that is formed of, for example, Li, Ca, LiF/Ca, LiF/Al, Al, Mg, or a compound thereof, and a second layer stacked on the first layer, in which the second layer is formed of, for example, ITO, IZO, ZnO, or $In_2O_3$. The second layer may be formed as an auxiliary electrode or as a bus electrode line. When the opposed electrode 475 is used as a reflection type electrode, the opposed electrode 475 may be formed of, for example, Li, Ca, LiF/Ca, LiF/Al, Al, Mg, or a compound thereof.

The interlayer 470 interposed between the pixel electrode 460 and the opposed electrode 475 may include, for example, a low molecular organic material or a polymer organic material.

When the interlayer 470 includes a low molecular organic material, then a hole injection layer (HIL), a hole transport layer (HTL), an emission layer (EML), an electron transport layer (ETL), and an electron injection layer (EIL) may be stacked individually or in a combined structure.

Suitable organic material may include, for example, copper phthalocyanine (CuPc), N,N'-Di(naphthalene-1-yl)-N,N'-diphenyl-benzidine (NPB), tris-8-hydroxyquinoline aluminum ($Alq_3$), etc. The lower molecular organic material may be formed in a vacuum deposition method using masks.

In some embodiments of the present invention, when the interlayer 470 includes a polymer organic material, the interlayer 470 may have a structure including the HTL and the EML. The HTL may include polyethylene dioxythiophene (PEDOT). The EML may include a poly-phenylenevinylene (PPV) based material or a polyfluorene based material.

The organic light-emitting layer may emit light of, for example, a color selected from red, green, or blue colors. According to another embodiment of the present invention, the organic light-emitting layer may emit white light, and the organic light-emitting display apparatus may further include color filter layers of red, green, and/or blue colors to output an image of various colors.

In some embodiments of the present invention, an encapsulation layer may be formed on the opposed electrode 475. The encapsulation layer may have a structure in which a plurality of inorganic films are stacked, or a structure in which an organic film and an inorganic film are alternately stacked.

In another embodiment of the present invention, an encapsulation substrate may be arranged on the opposed electrode 475. The substrate 405 may be hermetically sealed by the encapsulation substrate.

According to the various embodiments of the present invention, as described above, the TFT includes the active pattern having rounded edge portions. As a result, concentration of the electric field is reduced and thus problems that may arise due to the concentration of the electric field may be avoided or reduced. In other words, the hump phenomenon may be reduced or prevented, the leakage current may be reduced, and the cut-off properties may be improved. Also, parametric deviation factors of the TFT may be reduced so that random smudges on a panel in the organic light-emitting display apparatus including the TFT may be reduced or avoided.

It should be understood that the example embodiments described herein should be considered in a descriptive sense and not for purposes of limitation.

What is claimed is:

1. A thin film semiconductor device comprising:
   a substrate;
   an active pattern on the substrate and comprising a rounded upper edge portion;
   a first gate insulation film exposing the rounded upper edge portion of the active pattern and covering a flat upper surface of the active pattern;
   a second gate insulation film covering the rounded upper edge portion of the active pattern and covering the first gate insulation film; and
   a gate electrode overlapping a part of the active pattern,
   wherein the first gate insulation film and the second gate insulation film are interposed between the active pattern and the gate electrode.

2. The thin film semiconductor device of claim 1, wherein the active pattern further comprises:
   a source region;
   a drain region; and
   a channel region between the source region and the drain region, and comprising the rounded upper edge portion and a rounded lower edge portion.

3. The thin film semiconductor device of claim 2, further comprising a gate electrode extending across the active pattern in the channel region of the active pattern.

4. The thin film semiconductor device of claim 1, further comprising a buffer film interposed between the substrate and the active pattern,
   wherein the active pattern further comprises an angled lower edge portion.

5. The thin film semiconductor device of claim 1, wherein the active pattern further comprises a silicon material.

6. A thin film semiconductor device comprising:
   a substrate;
   an active pattern on the substrate and comprising a rounded upper edge portion and a rounded lower edge portion;
   a first buffer film on the substrate; and
   a second buffer film on the first buffer film and contacting a flat lower surface of the active pattern without contacting the rounded lower edge portion of the active pattern.

7. The thin film semiconductor device of claim 6, further comprising a thermal oxide film surrounding the rounded upper edge portion, the rounded lower edge portion, and a lateral surface of the active pattern,
   wherein a portion of the thermal oxide film on the rounded upper edge portion or on the rounded lower edge portion is thicker than a portion of the thermal oxide film on the lateral surface.

8. An organic light-emitting display apparatus comprising:
   a substrate;
   a plurality of thin film transistors on the substrate;
   a pixel electrode electrically connected to one of the plurality of thin film transistors;
   an opposed electrode on the pixel electrode; and
   an interlayer between the pixel electrode and the opposed electrode, and comprising an organic light-emitting layer,
   wherein the at least one of the plurality of thin film transistors further comprises:
   an active pattern on the substrate and comprising a rounded upper edge portion;
   a first gate insulation film exposing the rounded upper edge portion and covering a flat portion of an upper surface of the active pattern;
   a second gate insulation film covering the rounded upper edge portion and the first gate insulation film; and
   a gate electrode on the first gate insulation film and the second gate insulation film, and overlapping part of the active pattern.

9. The organic light-emitting display apparatus of claim claim 8, wherein the active pattern further comprises a rounded lower edge portion.

10. The organic light-emitting display apparatus of claim 9, further comprising:
    a first buffer film on the substrate; and
    a second buffer film on the first buffer film, and contacting a flat lower surface of the active pattern without contacting the rounded lower edge portion of the active pattern.

11. The organic light-emitting display apparatus of claim 8, wherein the active pattern comprises:
   a source region;
   a drain region; and
   a channel region between the source region and the drain region and comprising the rounded upper edge portion and a rounded lower edge portion.

\* \* \* \* \*